United States Patent [19]

Kondo et al.

[11] 3,933,495
[45] Jan. 20, 1976

[54] PRODUCING PLANOGRAPHIC PRINTING PLATE REQUIRING NO DAMPENING WATER

[75] Inventors: Asaji Kondo; Shizuo Miyano; Kenichiro Yazawa, all of Asaka, Japan

[73] Assignee: Fuji Photo Film Co., Ltd., Minami-ashigara, Japan

[22] Filed: May 14, 1973

[21] Appl. No.: 359,959

[30] Foreign Application Priority Data

May 12, 1972 Japan.............................. 47-47320

[52] U.S. Cl. .......................... 96/33; 96/49; 96/75; 96/91 R
[51] Int. Cl.² ........................................ G03F 7/02
[58] Field of Search.................. 96/33, 49, 75, 91 R

[56] References Cited
UNITED STATES PATENTS

| | | | |
|---|---|---|---|
| 3,046,116 | 7/1962 | Schmidt | 96/33 |
| 3,300,309 | 1/1967 | Chu | 96/33 |
| 3,511,178 | 5/1970 | Curtin | 96/33 |
| 3,591,575 | 7/1971 | Golda | 96/91 R |
| 3,615,538 | 10/1971 | Peters et al. | 96/75 |
| 3,669,660 | 6/1972 | Golda et al. | 96/91 |
| 3,677,178 | 7/1972 | Gipe | 96/33 |

OTHER PUBLICATIONS

The Lithographers Manual, 4th ed., 2nd ptg., 1970 – Shapiro, C. (ed.), pp. 10:20–10:22.
G. E. Silicones, CDS–129 G.G.E. Silicone Products Dept., Waterford, N.Y., p. 5.

*Primary Examiner*—David Klein
*Attorney, Agent, or Firm*—Sughrue, Rothwell, Mion, Zinn & Macpeak

[57] ABSTRACT

A presensitized planographic printing plate which can be used in both negative and positive work comprising a support, a layer formed on the support of a photosensitive substance prepared by the reaction at a pH of not more than 7.5 of a diazonium compound with a coupling agent, e.g., hydroxybenzophenone, and a layer formed on the photosensitive layer of a "one-package" silicone rubber curable at room temperature. A planographic printing plate per se is produced by imagewise exposing the presensitized plate through a negative or positive film, and treating the exposed plate with a treating liquid capable of removing those portions of the presensitized plate which correspond to the image area of the original. Dampening water is not required when printing is carried out using the resulting printing plate.

2 Claims, No Drawings

PRODUCING PLANOGRAPHIC PRINTING PLATE REQUIRING NO DAMPENING WATER

BACKGROUND OF THE INVENTION

1. Field of the Invention

This invention relates to a presensitized planographic printing plate which can be used both in negative and positive work and does not require dampening water during printing, and more specifically to a presensitized planographic printing plate comprising a combination of a photosensitive substance and a silicone rubber on a support, which can be used both in negative and positive work by changing the method of treatment after exposure.

2. Description of the Prior Art

The term "positive work" refers to printing on a presensitized plate using a positive film, and the term "negative work" refers to printing on a presensitized plate using a negative film.

In the preparation of planographic printing plates used mainly for offset printing, a photomechanically producible presensitized plate is exposed through a negative or positive film, and treated with a suitable developer. This treatment results in the imagewise formation of a hydrophilic portion and an oleophilic portion to yield a planographic printing plate which can be readily used. The olephilic portion accepts oily inks, and an image area is formed at the portion which is susceptible to ink adhesion. On the other hand, the hydrophilic portion repels oily inks, and a non-image area is formed at the portion to which the ink has not adhered. This is the essential concept of printing plates of this type. However, the ink receptivity of the oleophilic portion is not compatible with the ink repelling property of the hydrophilic portion. Accordingly, it is necessary to increase the ink-repelling property of the hydrophilic portion during printing by alternately supplying dampening water and oily ink.

This dampening operation has been one of the great defects of conventional offset planographic printing plates. It has long been desired in the art of offset planographic printing to remove the defects which accompany the use of dampening water such as the need for expert skill in balancing the supply of dampening water against that of the oily ink, the difficulty of producing printing inks not miscible with dampening water and the elongation or shrinkage of the printing plate.

In an attempt to remove these defects, methods were developed in which a silicone rubber layer which strongly repels ink was formed on the surface of the printing plate, thereby making it possible to carry out printing only by the supply of oily ink without the use of dampening water. For example, the Japanese language publication "Journal of Printing," Vol. 53, Oct. 19770, page 48 and November 1970, page 51, describes presensitized dry plates which do not require dampening water. Japanese Pat. Nos. 23042/69 and 16044/71, and U.S. Pat. No. 3,511,178 also disclose the production of presensitized printing plates which do not require dampening water.

The method of producing such presensitized plates generally comprises forming a silicone rubber layer on top of a photosensitive layer formed on a support, imagewise exposing the resulting structure, and then treating the exposed structure to remove the silicone rubber layer at the image areas while leaving it at the non-image areas. When the resulting printing plate is inked, the ink does not adhere to the non-image areas (where the silicone rubber remains) because the cohesive force of the ink is larger than the force of adherance between the ink and the silicone rubber. On the other hand, the ink adheres to the image areas which are free of the silicone rubber. The ink which has adhered only to the image areas is transferred to printing paper, and printed copies can be obtained. Since the silicone rubber layer has a sufficiently high ink repelling property, it is not necessary to supply dampening water as with conventional presensitized plates.

SUMMARY OF THE INVENTION

It has now been found that by using a specific combination of a photosensitive substance and a silicone rubber, a presensitized plate for offset printing can be produced which is usable for both negative and positive work simply by changing developers.

According to this invention, there is provided a presensitized planographic printing plate which can be used both in negative and positive work and does not require dampening water for printing, the plate comprising a support, a layer formed on the support of a photosensitive substance prepared by the reaction of a pH of not more than 7.5 of a diazonium compound with a coupling agent, e.g., hydroxybenzophenone, and a layer formed on the photosensitive layer of a one-package silicone rubber curable at room temperature.

DETAILED DESCRIPTION OF THE INVENTION

The presensitized plate of this invention can be used both for negative and positive work in spite of the fact that it contains only one kind of photosensitive substance. With conventional presensitized plates, different photosensitive substances are required for positive and negative work, and there is not known any presensitized plate which can be used for both positive and negative work which does not require dampening water for printing. The presensitized plate disclosed in the Japanese Pat. No. 16044/71 is usable only for negative work, and that disclosed in Japanese Pat. No. 23042/69 only for positive work.

The production of a presensitized plate which can be used for both positive work and for negative work and which does not require dampening water for printing is significant economically in view of productivity and cost. Also, it serves to simplify the plate-making operation, since it convenient to be able to use the presensitized plate for both positive and negative work.

The presensitized planographic printing plate in accordance with this invention can be produced only from a specific combination of a photosensitive substance formed from a diazonium compound and a coupling agent, e.g., hydroxybenzophenone, with a silicone rubber. It is not known why this is possible.

The general method for producing the presensitized planographic printing plate of this invention will now be described.

A layer of the photosensitive substance is formed on a support as is ordinarily used for the production of presensitized plates, such as an aluminum sheet, and for maximum adherance a silicone primer is coated thereon. The photosensitive layer preferably contains a water-insoluble binder. A layer of a "one-package" silicone rubber curable at room temperature is coated on top of the primer layer, following by allowing it to stand for more than several hours at room temperature or the rubber layer is cured at a temperature not greater than about 90°C.

The exact structure of the photosensitive substance is not known. Generally, the photosensitive substance is obtained by reacting a photosensitive diazonium compound and a coupling agent, preferably a compound having a hydroxybenzophenone skeleton, in equimolar proportions at a pH of not more than 7.5, more specifically 1 to 7.5.

The diazonium compound can be any of those aromatic diazo compounds known to the art, e.g., a condensation product with organic condensation agents which contain p-diazodiphenylamine, derivatives thereof, an aldehyde or acetal. Examples include condensation products formed between p-diazodiphenylamine and formaldehyde, zinc chloride or paraformaldehyde. Preferred condensation products are disclosed in U.S. Pat. Nos. 2,922,715 and 2,946,683. Especially preferred are p-diazodiphenylamineformaldehyde condensation products. The coupling agents of the present invention are acid aromatic compounds, e.g., benzene toluene, and naphthalene sulfonic acid (derivatives may also be used, such as alkali metal salts) and aromatic compounds which contain hydroxy group(s), for example, diphenolic acid, benzophenone, substituted benzophenone, naphthol, and alkali metal sulfonic acid salts thereof.

Specific examples of the compounds used are toluene sulfonic acid, 2,5-dimethylbenzene sulfonic acid, the sodium salt of benzene sulfonic acid or naphthalene-2-sulfonic acid, 1-naphthol-2-sulfonic acid, 2,4-dioxybenzophenone, 2,2'-dioxy-4,4'-dimethoxybenzophenone, 2,2'-4,4'-tetraoxybenzophenone, 2-oxy-4-methoxy-benzophenone-5-sulfonic acid. Most preferred is 2-hydroxy-4-methoxybenzophenone-5-sulfonic acid A preferred class of the benzophenone materials are those where the benzophenone group contains a hydroxy group and/or a methoxy group, more specifically, with less than 4 hydroxy groups, or with less than 4 methoxy groups or with less than 4 total hydroxy and methoxy groups, and those with at least one —COOH group or sulfonic acid group (less than 3 of such groups) also being useful. For example, polyhydroxybenzophenone or polyhydroxybenzophenones containing methoxy, carboxylic acid or sulfonic acid groups as defined above include 2,2', 4,4'-tetrahydroxybenzophenone, 2,2'-dihydroxy-4,4'-dimethoxybenzophenone, a 2,2'-dihydroxy-4,4'-dimethoxy-5-sulfobenzophenone alkali (metal) salt and 2-hydroxy-4-methoxybenzophenone-5-sulfonic acid. Those containing sulfonic acid groups prove especially superior with respect to stability and processability.

When the photosensitive diazonium compound and the hydroxybenzophenone are reacted at a high pH, an azo compound may be formed to reduce photosensitivity. The molar ratio of the diazonium compound and the coupling agent, e.g., hydroxybenzophenone, is 1:1 in the condensate.

Accordingly, the pH of the reaction system should be maintained at not more than 7.5, preferably at pH 1– pH = 7.5. These two compounds can be reacted, and the reaction product may be isolated prior to use for the preparation of the presensitized plate.

The condensate is easily formed by mixing 2% – 20 wt% solutions of the components with stirring and maintaining at room temperature and at one pressure until reaction is completed, and then washed the precipitate formed and drying it.

The photosensitive substance may be applied as it is in a solution in an alcohol or a halogenated hydrocarbon, for example, isopropylalcohol, n-propylalcohol, ethanol, methanol, n-butanol, dichloroethane, methylenechloride, benzylalochol, trichloroethylene, and the like. However, it is prefered to use a binder. Examples of the binder are epoxy resins, phenol resins polyamide resins, polyvinylidene chloride resins and cellulose esters. Epoxy resins are preferred as the binder since the condensation product of diazonium is very stable therein. Phenol resin are not preferred due to a tendancy to cause the condensate to be unstable and difficulty of development. Vinyl resin can be used, for example, acrylic acids, polyvinyl hydrogen phthalates, polyvinyl chloride and polyvinyl pyrollidone. They are not preferred, however, because they are difficult to develop and often do not adhere well to the silicone rubber.

Adequately, the amount of the binder is one to one-fifth the weight of the photosensitive substance. It is sufficient if the thickness of the photosensitive substance layer is in the range of from 0.1 to 3 microns, preferably 0.3 to 1.5 microns, most preferably from 0.6 to 1.3 microns.

The silicone rubber can be a "one-package" system, curable at room temperature (no other components need be added) and includes, for example, those of the deoximization or deacetoxylation type, available under the tradenames Toray Silicone SH-780 RTV and SH-781 RTV, Toshiba Silicone TSE-370 RTV, or Shinetsu Chemical Silicone KE 41-RTV and KE 42-RTV. They can be used, for example, as a 3–10% solution, based on solution weight, in a hydrocarbon, e.g., n-heptane, n-hexane, or solvent naphtha (for example, VMP naphtha). The silicone rubber layer has a thickness of 2 to 5 microns. Prior to coating of the silicone rubber, a primer such a Toray Silicone Primer PRX-304or SH 506 can be effectively used.

The preferred silicone rubbers contain the repeating structural unit

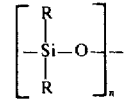

where $n = 2 - 2000$. R can be the same one or different. R is preferably alkyl, aryl, or cyano alkyl, and most preferably substantially all R groups are methyl groups, with less than 2 – 3% of the R groups being different, e.g., vinyl, phenyl, halogo vinyl or halogenophenyl.

The preferred (silicone rubbers) contain the following terminal groups:

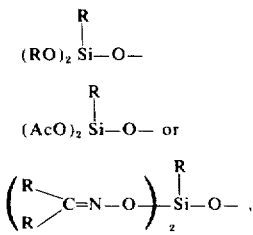

where R is alkyl and Ac is a fatty acid.

These groups are eliminated upon curing and a silicone elastomer is yielded. "Deoximization" or "deacetoxylation" is used to describe the product, according to the compounds, e.g., where oxime is eliminated from the tip to yield an elastomer this is a "deoximization."

The thus formed silicone elastomer can be termed a polysiloxane whose average molecular weight is 400,000 – 800,000.

All of the trade marked materials identified are silicone rubbers within the above definition, e.g., SH-780 is a silicone rubber where oxime is eliminated upon hardening, and SH-781 and TSE-370 are silicone rubber where acetic acid is eliminated upon hardening.

The primer serves to increase bonding strength and is generally "painted" between the silicone elastomer and the support. The primers are basically carbon functional silanes applied as a 1 – 30 wt% solution in n-heptane or naphtha. Preferred carbon functional silanes are those of the formula:

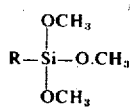

where R is

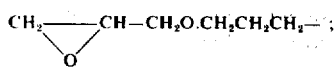

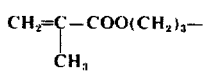

and the like.

Examples of the support are an aluminum sheet whose surface is grained or anodically oxidized, or synthetic resin film, or a tough paper. Preferred synthetic resin supports include polyethylene terephthalate, polycarbonate and cellulose triacetate film. Preferred papers are polymer laminated papers, e.g., vinyl chloride coated paper, polyethylene coated paper; paper laminated with aluminum can also be used.

In order to form a printing plate, the resulting presensitized plate is subjected to a printing process using a transparent negative or positive film which has been prepared through an original consisting of image and non-image areas. In negative work, the presensitized plate is exposed through a negative film, and treated with a treating liquid such as cyclohexanone. This treatment results in the removal of the photosensitive layer and the silicone rubber layer at the image area (the portion exposed to light), while the portions of the photosensitive substance layer and silicone rubber layer which correspond to the non-image area of the original (the portion not exposed to light) remain unremoved. Thus, the surface of the support is revealed to form a planographic printing plate. When the printing plate so obtained is inked, the ink adheres only to the image portion and by the transfer of the ink to paper, impressions can be obtained.

On the other hand, in positive work, the presensitized plate is exposed through a positive film, and treated by either of the following methods.

1. When the exposed plate is treated with a mixed solvent consisting of an ester, an alcohol and water, the silicone rubber layer at the non-image area (the portion exposed to light) remains unremoved, while that portion of the silicone rubber which corresponds to the image area of the original (the portion not exposed to light) is removed to reveal the photosensitive layer. When the printing plate so produced is inked, the ink adheres only to the image area, and impressions can be obtained.

2. At some time before or after exposure through the positive film, the presensitized plate is heated for several minutes at a temperature of not less than 120°C. When such a presensitized plate is treated with butyrolactone, the photosensitive layer and silicone rubber layer are removed at the image area (the portion not exposed to light), while the non-image area (the portion exposed to light) remains unremoved. The surface of the support is thus revealed. When the resultant printing plate is inked, the ink adheres to the revealed surface, and impressions can be obtained.

The treating liquid performs the function of removing that portion of the presensitized plate which corresponds to the image area of the original after exposure of the plate. It is generally called a developer, and may differ according to the composition of the photosensitive substance. For example, when a reaction product formed from the above-mentioned condensed diazonium compound and 2-hydroxy-4-methoxybenzophenone-5-sulfonic acid is used as the photosensitive substance, cyclohexanone is used as the treating liquid in negative work. In positive work, a mixture of butyl acetate, n-propanol and water in a ratio of 2 : 5 : 1 (volume) is used; or after heating the presensitized plate to 120°C, γ-butyrolactone or methyl cellosolve is used. The exact choice of the treating liquid is determined experimentally according to the individual photosensitive substance.

Typical of the exposure conditions is one for 60 seconds at 90 cm distance with a 35 amp. double arc light. As will be apparent to the art, this is not a limitative range. Preferred treating liquids are, in the case of negative work, cyclohexane, and in the case of positive work, n-heptane, naphtha, methylcellosolve, cyclohexanone and γ-butyrolactone.

Best results are obtained in the case of positive work by treating for 90°C, 3 minutes with n-heptane, 90°C, 5 minutes with naphtha, 90°C, 7 minutes with methylcellosolve or 90°C, 10 minutes with γ-butyrolactone.

The following Examples further illustrate preferred embodiments of the invention.

EXAMPLE 1

A photosensitive substance was prepared from equimolar proportions of a condensation product between p-diazophenylamine and formaldehyde (1 wt part : 2 wt parts), and 2-hydroxy-4-methoxybenzophenone-5-sulfonic acid by reacting at a pH of 1 – 7.5 at room temperature and at one atmosphere. A 5% methyl cellosolve solution of the resultant photosensitive substance was mixed with a 2% solution of an epoxy resin (Epon 1031, tradename for the product of Shell Chemicals Corp., epoxy resin which is the tetraglycidyl ether of hydroxyphenyl ethane). The mixture was coated on a conventional, anodically oxidized aluminum plate in an amount of 1.3 g/m² (dry weight) at 1μ thickness to form a coated layer of the photosensitive substance.

A very thin (50 – 100 A) primer layer was formed on the surface of the photosensitive layer by bringing a cloth impregnated with Silicone Primer PRX-304 (product of Toray Silicone) into light contact with the surface of the photosensitive layer. After allowing the assembly to stand for 0.5 to 2 hours at room temperature, a 5% n-heptane solution of one-package silicone rubber (SH-781 RTV of Toray Silcone) was coated on the primer layer in an amount of 60 ml/m² (acetic acid eliminates).

When this plate was heated for several minutes at 90°C., or allowed to stand for more than 3 hours at room temperature, it was ready for immediate use in plate-making. It was confirmed that even when this plate was used for plate-making after storage for 3 months and 6 months, respectively, it had the same properties as the original one.

Negative and positive printing films were produced through a test chart original, and the following work done.

Negative Work

The presensitized plate was exposed through the negative film for 3 minutes with a 35 amp double arc lamp using a printer (Plano PS Printer A-3, product of Fuji Photo Film Co., Ltd.), and then developed in a customary manner with a cyclohexanone treating liquid (room temperature; 3 minutes immersion). The part corresponding to the image area of the original (the portion exposed to light) was removed, and the aluminum surface was revealed. The part which was not exposed to light (the non-image area) did not undergo any change.

The resulting printing plate was mounted on an offset printing press (Daulith 500, Davidon Company) from which the water supply device had been removed. Printing was carried out using a blue ink for dryography (Sun Chemical, U.S.A.), and 10,000 impressions were obtained.

Positive Work

The presensitized plate was exposed for 3 minutes using a 35 amp double arc lamp through the positive film using a printer, and then developed with a mixed liquid of ethyl acetate, propanol and water in a ratio of 2 : 5: 1 (volume) at room temperature for 3 to 4 minutes. The silicone rubber layer at a part corresponding to the image area of the original (the portion not exposed to light) was removed to form a printing plate. Alternatively, after the exposure, the plate was heated at 120°C for 10 minutes, and treated with γ-butyrolactone at room temperature for 3 to 4 minutes. The part corresponding to the image area was removed to reveal the aluminum surface. Using either of these printing plates, more than 5,000 impressions were obtained without supplying dampening water.

Good results were obtained when the binder was used over the 1–1/5 wt parts ratio to 1 part photosensitive substance heretofore defined.

EXAMPLE 2

Instead of the hydroxybenzophenone compound in Example 1, 2,2',4,4'-tetrahydroxybenzophenone was used. The results were the same as in Example 1.

EXAMPLE 3

Instead of the epoxy resin as binder in Example 1, Saran or polyvinyl hydrogen phthalate was used. The results were the same as in Example 1.

While the invention has been described in detail and with reference to specific embodiments thereof, it will be apparent to one skilled in the art that various changes and modifications can be made therein without departing from the spirit and scope thereof.

What is claimed is:

1. A process for producing a planographic printing plate, which does not require dampening water for printing, which comprises image-wise exposing through a positive film a presensitized plate comprising a support, a layer formed on said support of a photosensitive substance prepared by the reaction at a pH of not more than 7.5 of the condensation product of p-diazophenylamine and formaldehyde with 2-hydroxy-4-methoxybenzopheneone-5-sulfonic acid and a layer formed on said photosensitive layer of a one package silicone rubber curable at room temperature, heating said plate before or after exposure at a temperature not less than 120°C and treating said exposed presensitized plate with a treating solution of γ-butyrolactone or methyl cellosolve capable of removing only the non-exposed portion of said exposed presensitized plate.

2. A process for producing a planographic printing plate, which does not require dampening water for printing, which comprises image-wise exposing through a positive film a presensitized plate comprising a support, a layer formed on said support of a photosensitive substance prepared by the reaction at a pH of nor more than 7.5 of the condensation product of p-diazophenylamine and formaldehyde with 2-hydroxy-4-methoxybenzophenone-5-sulfonic acid and a layer formed on said photosensitive layer of a one package silicone rubber curable at room temperature and treating said exposed presensitized plate with a mixed solvent of butyl or ethyl acetate, n-propanol and water in a ratio of 2:5:1 (volume) capable of removing only the non-exposed portion of said exposed presensitized plate.

* * * * *